(12) United States Patent
Hayashi et al.

(10) Patent No.: US 6,653,156 B2
(45) Date of Patent: Nov. 25, 2003

(54) FERROELECTRIC DEVICE WITH CAPPING LAYER AND METHOD OF MAKING SAME

(75) Inventors: Shinichiro Hayashi, Takatsuki (JP); Tatsuo Otsuki, Takatsuki (JP); Carlos A. Paz de Araujo, Colorado Springs, CO (US)

(73) Assignees: Symetrix Corporation, Colorado Springs, CO (US); Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/262,034

(22) Filed: Sep. 30, 2002

(65) Prior Publication Data

US 2003/0034548 A1 Feb. 20, 2003

Related U.S. Application Data

(62) Division of application No. 09/229,883, filed on Jan. 14, 1999.

(51) Int. Cl.⁷ ..................... H01L 21/00; H01L 21/8242
(52) U.S. Cl. ........................................ 438/3; 438/240
(58) Field of Search ........................................ 438/240

(56) References Cited

U.S. PATENT DOCUMENTS

| | | |
|---|---|---|
| 5,426,075 A | 6/1995 | Perino et al. |
| 5,439,845 A | 8/1995 | Watanabe et al. |
| 5,453,908 A | 9/1995 | Tsu et al. |
| 5,519,234 A | 5/1996 | Paz de Araujo et al. |
| 5,519,566 A | 5/1996 | Perino et al. |
| 5,576,564 A | 11/1996 | Satoh et al. |
| 5,708,302 A * | 1/1998 | Azuma et al. .............. 257/751 |
| 5,736,759 A | 4/1998 | Haushalter |
| 5,760,433 A | 6/1998 | Ramer et al. |
| 5,767,543 A | 6/1998 | Ooms et al. |
| 5,780,886 A | 7/1998 | Yamanobe et al. |
| 5,781,404 A | 7/1998 | Summerfelt et al. |
| 5,784,310 A | 7/1998 | Cuchiaro et al. |
| 5,888,296 A | 3/1999 | Ooms et al. |
| 6,184,927 B1 * | 2/2001 | Kang .................... 348/240.99 |

OTHER PUBLICATIONS

Yamawaki et al., "Ultra Thin SrBi2Ta2O9 Ferroelectric Films Grown by Liquid Source CVD Using BiOx Buffer Layers," Extended Abstracts of the 1998 International Conference on Solid State Devices and Materials, 0. 102–103 (1998).

Matsuki et al., "Crystalline–Buffer–Layer–Aided (CBL) Sputtering Technique for Mega–Bit Ferroelectric Memory Devices with SrBi2Ta2O9 Capacitors," IEDM 96, IEEE, p. 691–694 (Aug. 12, 1996).

* cited by examiner

Primary Examiner—Olik Chaudhuri
Assistant Examiner—William M. Brewster
(74) Attorney, Agent, or Firm—Patton Boggs

(57) ABSTRACT

A ferroelectric device includes a ferroelectric layer and an electrode. The ferroelectric material is made of a perovskite or a layered superlattice material. A superlattice generator metal oxide is deposited as a capping layer between said ferroelectric layer and said electrode to improve the residual polarization capacity of the ferroelectric layer.

15 Claims, 3 Drawing Sheets

FERROELECTRIC DEVICE WITH CAPPING LAYER AND METHOD OF MAKING SAME

RELATED APPLICATIONS

This application is a divisional application of copending application Ser. No. 09/229,883 filed Jan. 14, 1999.

BACKGROUND OF THE INVENTION

1. Field of the Invention

The present invention pertains to the field of thin films for use in integrated circuits, and particularly ferroelectric thin films. More specifically, a specialized capping layer enhances the performance of ferroelectric thin films.

2. Statement of the Problem

Ferroelectric materials are characterized by their ability to retain an induced polarization state even in the absence of an applied electric field. If the polarization state in one direction is identified as logic "0" polarization state and the polarization state in the opposite direction is identified as a logic "1" polarization state, and appropriate circuitry is provided to sense the polarization state, ferroelectric thin films can be used as the information storage medium of a high speed nonvolatile computer memory. It is known that such a ferroelectric memory can be made by substituting a ferroelectric material for the dielectric capacitor material of a conventional DRAM capacitor circuit and making appropriate changes in the read and write circuits to utilized the ferroelectric film as the information storage medium. See, for example, U.S. Pat. No. 5,784,310 issued Jul. 21, 1998 to Cuchiaro et al. This substitution converts the DRAM cell to a nonvolatile memory cell due to long-term retention of an induced polarization state in the ferroelectric material even in the absence of an applied field. It is also possible to make a ferroelectric memory cell consisting of a single field effect transistor due to the nonvolatile polarization state of ferroelectric thin films, as described in U.S. Pat. No. 5,780,886 to Yamanobe et al.

A problem arising in the use of thin film ferroelectrics is that point charge defects at the thin film surfaces have the effect of screening the applied field due to the presence of induced charge at the thin film surface creating a field opposite to the applied field. Thus, some of the interior ferroelectric domains of the crystal are never exposed to a field having sufficient magnitude to completely polarize the domains. The polarization performance of the films suffers as a result of this field screening. Ferroelectric memory densities are limited by the magnitude of residual polarization that may be obtained from the ferroelectric material. In addition, prior thin film ferroelectric materials typically have high polarization fatigue rates making the memories unreliable in long-term use because the magnitude of polarization decreases with use. Further, it is also possible for the polarization hysteresis curves of thin film ferroelectrics to shift or imprint relative to a zero voltage or zero field value. Ultimately, with either the fatigue or imprint problems, control circuitry that is coupled with known ferroelectric materials will be unable to read the fatigued polarization state of the materials and, therefore, unable to store or retrieve bits of information. Thus, there exists a need to increase the polarization of thin film ferroelectrics for the purpose of improving ferroelectric memories.

The fatigue and imprint problems can be largely overcome through the use of layered superlattice materials, as reported in U.S. Pat. No. 5,784,310 issued Jul. 21, 1998 to Cuchiaro et al. Ferroelectric perovskite-like layered superlattice materials are a known class of self-ordering crystals, and have been used in thin films suitable for use in integrated circuits, e.g., as reported in U.S. Pat. No. 5,519,234 issued May 21, 1996 to Araujo et al. The term "perovskite-like" usually refers to a number of interconnected oxygen octahedra. A primary cell is typically formed of an oxygen octahedral positioned within a cube that is defined by large A-site metals where the oxygen atoms occupy the planar face centers of the cube and a small B-site element occupies the center of the cube. In some instances, the oxygen octahedra may be preserved in the absence of A-site elements.

The layered superlattice materials are characterized by an ability to find thermodynamic stability in layered structures. Disordered solutions of superlattice-forming metals, when exposed to thermal treatments, spontaneously form a single layered superlattice material compound having intercollated layers of perovskite-like octahedrons and a superlattice generator such as bismuth oxide. The resultant self-ordered structure forms a superlattice by virtue of a dual periodicity corresponding to the repeated layers. The layered superlattice materials have this self-ordering ability and, consequently, are distinct from semiconductor heterolattices which require the deposition of each layer in a separate deposition step.

It is known that the polarizability of layered superlattice materials is reduced if stoichiometric precursors are used, since some elements, such as bismuth, are more volatile and are disproportionately removed from the materials during drying and annealing. Therefore, precursors using excess amounts of these volatile elements are often used so that, after drying and annealing, the resulting material is approximately stoichiometric. Bismuth gradients have also been used to obtain essentially stoichiometric final layered superlattice materials. See, for example, U.S. Pat. No. 5,439,845 issued Aug. 8, 1995 to Watanabe et al. While the devices using a gradient show enhanced polarizability, they also must be relatively thick because of the multiple layers, resulting in lower density of the ferroelectric memory.

There remains a need to obtain greater residual polarization values from thin film ferroelectrics and, particularly, the layered superlattice materials, for the purpose of increasing the density of ferroelectric memories and other integrated circuits that contain ferroelectrics.

SOLUTION

The present invention advances the art and overcomes the aforementioned problems by providing improved thin film ferroelectric devices having an enhanced magnitude of residual polarization. These improvements derive from the use of a capping layer between the electrode and the ferroelectric material to compensate defects at the interface between the ferroelectric material and the electrode. Improvements in residual polarization measurements as large as 32% have been derived from the use of the invention.

A ferroelectric device according to the invention includes a substrate supporting a thin film ferroelectric layer selected from the group consisting of perovskites and self-ordering layered superlattice materials. The ferroelectric material is "capped" on one or both the top and bottom side by a capping layer. Preferably, the capping layer is a non-ferroelectric material. An electrode is above or below the capping layer. The capping layer is preferably at least 3 nanometers (nm) thick, and preferably resides in direct contact with both the electrode and the ferroelectric material.

The capping layer is enriched with a superlattice generator metal, which is usually trivalent bismuth and may also be trivalent thallium. Preferably, the capping layer material is selected from the group consisting of bismuth oxide, bismuth strontate, bismuth tantalate, bismuth niobate, and bismuth niobium tantalate.

Preferably, the capping layer caps the ferroelectric material beneath the top electrode, but if there are two electrodes, such as in a ferroelectric capacitor, the capping layer may cap both the top and bottom of the ferroelectric layer.

In the preferred embodiments, the superlattice generator metal is identical to a superlattice generator metal in the self-ordering layered superlattice material. In preferred embodiments, the ferroelectric layer consists essentially of a bismuth-containing self-ordering layered superlattice material, and the superlattice generator metal consists essentially of bismuth. Particularly preferred layered superlattice materials are selected from the group consisting of strontium bismuth tantalate, strontium bismuth niobate, and strontium bismuth niobium tantalate. The most preferred capping layer material is bismuth oxide.

The capping layer is preferably at least about 3 nm thick, and preferably ranges from 3 nm to 30 nm in thickness, with the most preferred thicknesses ranging from 5 nm to 20 nm to provide adequate defect compensation while being thin enough to avoid significant problems with parasitic capacitance.

The use of the capping layer appears to prevent field screening by providing a transition from the ferroelectric to the conductor. It permits very thin ferroelectric devices with excellent ferroelectric properties. Numerous other features, objects and advantages of the invention will become apparent from the following description when read in conjunction with the accompanying drawings.

DETAILED DESCRIPTION OF THE PREFERRED EMBODIMENT

An Improved Ferroelectric Device

Figure 1:
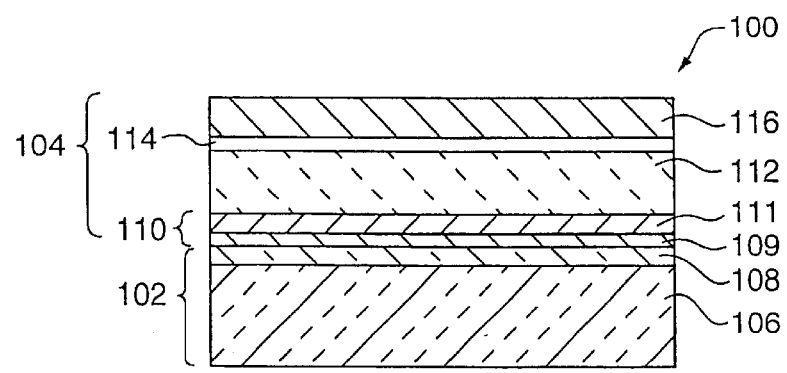
FIG. 1 depicts a ferroelectric device according to the invention with a capping layer atop a ferroelectric layer and beneath a top electrode.

FIG. 1 depicts a ferroelectric device 100 including a substrate 102 supporting a ferroelectric capacitor 104. Ferroelectric device 100 is a thin film ferroelectric capacitor having utility in ferroelectric memories and other integrated circuit applications that require ferroelectrics. For example, ferroelectric device 100 is useful as a ferroelectric capacitor or as a gate in a field effect transistor ("FET").

Substrate 102 includes a semiconducting wafer 106, preferably silicon, and an insulating layer 108, preferably silicon dioxide. In the integrated circuit art, the wafer 106 is often referred to as a "substrate". Herein, the term "substrate" is more generally applied to any layer or combination of layers providing support for yet another layer. For example, the substrate 102 for ferroelectric capacitor 104 is immediately the insulating layer 108, but also can be broadly interpreted to include the wafer 106 and the combination of wafer 106 with insulating layer 108. As is conventional in the art, we shall also refer to the device in various states of completion as a substrate, which is intended to include all of the layers completed up to the point of time in reference.

Terms of orientation, such as "above", "top", "upper", "below", "bottom", and "lower" herein mean relative to the wafer 106 in FIGS. 1–3. That is, if a second element is "above" a first element, it means it is farther from the wafer 106; and if it is "below" another element, then it is closer to the wafer 106 than the other element. The long dimension of wafer 106 defines a plane that is considered to be a "horizontal" plane herein, and directions perpendicular to this plane are considered to be "vertical".

The term "thin film" herein means a thin film of a thickness appropriate to be used in an integrated circuit. Such thin films are less than 1 micron in thickness, and generally are in the range of 2 nanometers (nm) to 500 nm. It is important to distinguish this term from the same term, i.e., "thin film", as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

Ferroelectric capacitor 104 contains a metal bottom electrode 110. The metal bottom electrode structure can be any metal or electrode structure suitable for use in integrated circuits, e.g., aluminum, gold, ruthenium, rhodium, and palladium. Bottom electrode 110 is preferably made of a combination of platinum 111 and titanium 109 where titanium functions as an adhesion metal to prevent peeling of the platinum component away from the oxide layer. Tantalum, iridium and iridium oxide are also useful as adhesion metals. The titanium or other adhesion metal 109 is typically sputtered to a thickness ranging from 10 nm to 20 nm. The platinum 111 preferably ranges from 100 nm to 200 nm thick. The metal layers of bottom electrode 110 are formed by conventional atomic sputtering techniques, such as DC magnetron sputtering or radio frequency sputtering.

A ferroelectric layer 112 resides atop bottom electrode 110. Ferroelectric layer 112 is preferably a metal oxide having a high dielectric constant and ferroelectric properties. Ferroelectric layer 112 is fabricated as described in detail below and is preferably less than about 400 nm thick, and most preferably less than about 200 nm thick. Ferroelectric layer 112 may be a perovskite, such as barium strontium titanate or strontium titanate. Ferroelectric layer 112 is more preferably a layered superlattice material, and is most preferably a mixed layered superlattice material.

The term "perovskite" herein includes a known class of material having the general form $ABO_3$, where A and B are cations and O is an oxygen anion component. This term is intended to include materials where A and B represent multiple elements; for example, it includes materials of the form $A'A''BO_3$, $AB'B''O_3$, and $A'A''B'B''O_3$, where A', A'', B' and B'' are different metal elements. Preferably, A, A', and A'' are metals selected from the group of metals consisting of Ba, Bi, Sr, Pb, Ca, and La; and B, B', and B" are metals selected from the group consisting of Ti, Zr, Ta, Mo, W, and Nb. The terms A-site and B-site refer to specific positions in the perovskite oxygen octahedral lattice.

Many layered superlattice materials have a plurality of perovskite-like oxygen octahedron layers separated by a corresponding number of bismuth oxide layers. Layered superlattice materials are typically ferroelectric materials, though not all such materials may exhibit ferroelectric behavior at room temperature. These materials normally have high dielectric constants, and are useful in high dielectric constant capacitors, whether or not they are ferroelectric.

All types of layered superlattice materials may be generally summarized under the average empirical formula:

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2} \quad (1)$$

Note that Formula (1) refers to a stoichiometrically balanced list of superlattice-forming moieties. Formula (1) does not represent a unit cell construction, nor does it attempt to allocate ingredients to the respective layers. In Formula (1), A1, A2 ... Aj represent A-site elements in a perovskite-like octahedral structure, which includes elements such as strontium, calcium, barium, bismuth, lead, and mixtures thereof, as well as other metals of similar ionic radius. S1, S2 ... Sk represent superlattice generator elements, which preferably include only bismuth, but can also include trivalent materials such as yttrium, scandium, lanthanum, antimony, chromium, and thallium. B1, B2 ... Bl represent B-site elements in the perovskite-like structure, which may be elements such as titanium, tantalum, hafnium, tungsten, niobium, vanadium, zirconium, and other elements; and Q represents an anion, which preferably is oxygen but may also be other elements, such as fluorine, chlorine and hybrids of these elements, such as the oxyfluorides, the oxychlorides, etc. The superscripts in Formula (1) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (1) includes the cases where the unit cell may vary throughout the material, e.g., in $Sr_{0.75}Ba_{25}Bi_2Ta_2O_9$, where, on the average, 75% of the time Sr is the A-site atom and 25% of the time Ba is the A-site atom. If there is only one A-site element in the compound, then it is represented by the "A1" element, and w2 ... wj all equal zero. If there is only one B-site element in the compound, then it is represented by the "B1" element, and y2 ... yl all equal zero, and similarly for the superlattice generator elements. The usual case is that there is one A-site element, one superlattice generator element, and one or two B-site elements, although Formula (1) is written in the more general form because the invention is intended to include the cases where either of the A and B sites and the superlattice generator can have multiple elements. The value of z is found from the equation:

$$(a1w1+a2w2\ldots+ajwj)+(s1x1+s2x2\ldots+skxk)+(b1y1+b2y2\ldots+blyl)=2z. \quad (2)$$

The layered superlattice materials by definition do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedrons.

The term "superlattice generator elements" as applied to S1, S2 ... Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator; but bismuth, if present in amounts less than a threshold stoichiometric proportion, will spontaneously concentrate as a non-perovskite-like bismuth oxide layer.

The term "layered superlattice material" herein also includes doped layered superlattice materials. That is, any of the material included in Formula (1) may be doped with a variety of materials, such as silicon, germanium, uranium, zirconium, tin, chromium, dysprosium, or hafnium.

Formula (1) at least includes all three of the Smolenskii-type ferroelectric layered superlattice materials; namely, those having the respective empirical formulae:

$$A_{m-1}S_2B_mO_{3m+3}; \quad (3)$$

$$A_{m+1}B_mO_{3m+1}; \text{ and} \quad (4)$$

$$A_mB_mO_{3m+2}, \quad (5)$$

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number, the overall average empirical formula provides for a plurality of different or mixed perovskite-like layers wherein the respective layers have different thicknesses of perovskite-like oxygen octahedrons.

A capping layer 114 is formed atop ferroelectric layer 112. Capping layer 114 is used to compensate point charge defects in the upper surface of ferroelectric layer 112. In the preferred applications that use layered superlattice materials for ferroelectric layer 112, the capping layer 114 is preferably an oxide of the superlattice generator metal. The best known superlattice generator metal is presently bismuth oxide and, consequently, capping layer 114 is most preferably deposited as bismuth oxide having a thickness greater than the normal periodicity of a bismuth oxide sequence in the superlattice. Preferably, the capping layer material is selected from the group consisting of bismuth oxide, bismuth strontate, bismuth tantalate, bismuth niobate, and bismuth niobium tantalate. The preferred thickness of the capping layer is at least 3 nm, and preferably ranges from 3 nm to 30 nm, with the most preferred thickness ranging from 5 nm to 20 nm. The best results are obtained with thicknesses of 10 nm. Capping layers thicker than about 30 nm may result in a parasitic capacitance due to the dielectric behavior of the capping material with associated screening of the applied field in a deleterious manner similar to screening of the field by charge defects.

In some circumstances, capping layer 114 is thin enough to diffuse into the ferroelectric layer 112. Similarly, ferroelectric layer 112 may diffuse into capping layer 114 or the layers may interdiffuse.

Where ferroelectric layer 112 is a perovskite, the effect of this interdiffusion is normally to produce a localized layered superlattice material region atop the perovskite. When bismuth is the superlattice generator element, for example, a bismuth-enriched layered superlattice material region corresponding to capping layer 114 depicted in FIG. 1 is typically formed. This layered superlattice material region consists of a spontaneously ordered superlattice that arises as the interdiffused metal oxides seek thermodynamic stability in layered sequences. Similarly, where ferroelectric layer 112 is a layered superlattice material, the effect of interdiffusion is to produce a superlattice generator element-enriched layered superlattice material region corresponding to capping layer 114 depicted in FIG. 1. If the capping layer does not diffuse into the ferroelectric layer 112, then, both in the case where the ferroelectric layer 112 is a perovskite and the case where the ferroelectric layer 112 is a layered superlattice material, the capping layer itself, as deposited, is a layer that is enriched in the superlattice generator element in the sense that it contains more of the superlattice generator element per mole then either the perovskite or the layered superlattice material. For example, if the capping layer 116 contains a superlattice generator metal other than bismuth, a bismuth-enriched capping layer is formed in each of the three cases. As used herein, all of the alternatives discussed in this paragraph are within the meaning of the term "superlattice generator metal-enriched capping layer," as applied to capping layer 114. Again, superlattice generator elements, also referred to as superlattice generator metals, are trivalent metals having ionic radii similar to those of bismuth and thallium.

A top electrode 116 is typically about 100 nm to 200 nm thick, and is usually made of the same metal or electrode structure as the bottom electrode 110, except titanium or other adhesion metal is normally not needed. Top electrode 116 may also have a different structure or be made of a different metal than bottom electrode 110.

As is known in the art, the ferroelectric device 100 may include other conventional layers, such as diffusion barrier layers. Many other materials may be used for any of the layers discussed above, such as silicon nitride for insulating layer 108; gallium arsenide, indium antimonide, magnesium oxide, strontium titanate, sapphire or quartz for wafer 106; and many other adhesion layers, barrier layers, and electrode materials. Bottom electrode 110 may be eliminated, in which case ferroelectric device 100 is no longer a ferroelectric capacitor, and becomes useful as a 1T or transistor gate in what is known as a metal-ferroelectric-insulator-semiconductor cell. Further, it should be understood that FIG. 1 is not meant to be an actual cross-sectional view of any particular portion of an actual electronic device, but is merely an idealized representation which is employed to more clearly and fully depict the structure and process of the invention than would otherwise be possible. For example, the relative thicknesses of the individual layers are not depicted proportionately, since otherwise some layers, such as the substrate 106, would be so thick as to make the drawing unwieldy.

A Second Embodiment for Comparative Purposes

Figure 2:
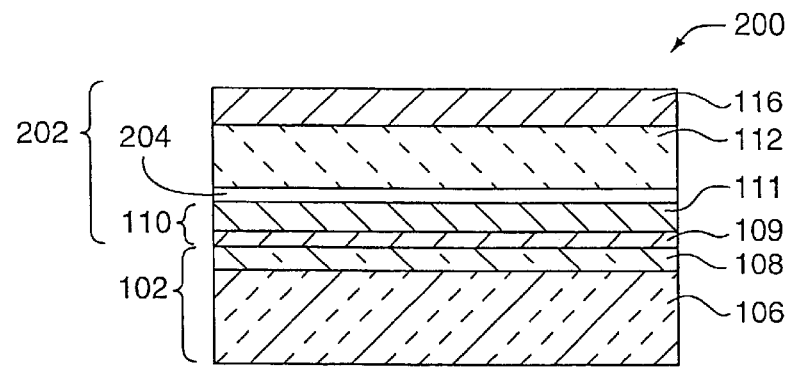
FIG. 2 depicts a ferroelectric device having a capping layer beneath the ferroelectric layer and above a bottom electrode.

FIG. 2 depicts a second ferroelectric device 200. In FIG. 2, like numbering of identical components has been retained with respect to FIG. 1. Ferroelectric device 200 contains a ferroelectric capacitor 202 that differs from ferroelectric capacitor 104 by the addition of a bismuth oxide capping layer 204 interposed between ferroelectric layer 112 and bottom electrode 110. Upper capping layer 114 is absent in the FIG. 2 embodiment, but capping layer 114 could also be included in place between top electrode 116 and ferroelectric layer 112.

A Third Device (Prior Art) for Comparative Purposes

Figure 3:
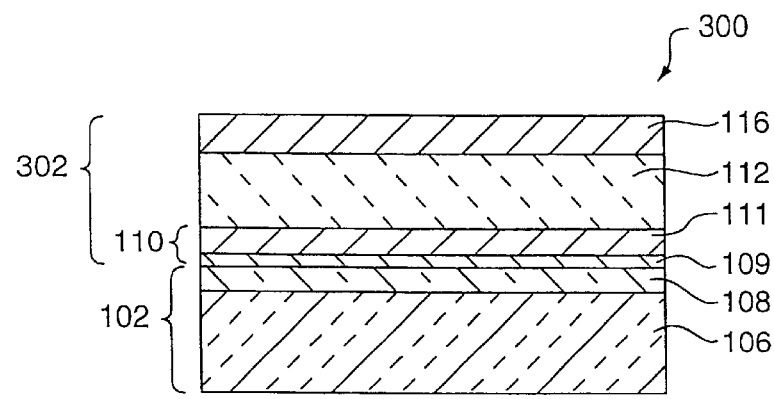
FIG. 3 depicts a comparative device having no capping layer in the manner of FIGS. 1 and 2.

FIG. 3 depicts a prior art ferroelectric device 300. In FIG. 3, like numbering of identical components has been retained with respect to FIG. 1. Ferroelectric device 300 contains a ferroelectric capacitor 302 that differs from ferroelectric capacitors 104 and 202 by having no capping layer 114 and no capping layer 204.

A Method of Making Device 100

All of the components of device 100, device 200 and device 300 are made according to known methods, except capping layers 114 and 204. These conventional methods are well known in the art and include, for example, thermal oxidation of wafer 106 to yield insulating layer 108 or spin-on glass deposition of layer 108 with a substantially similar result. Conventional sputtering processes are used to deposit bottom electrode 110 and top electrode 116. Conventional resist etching techniques are used to pattern the devices for their inclusion in integrated circuits. These processes are not critical to the invention. For example, substrate 102 is alternatively a stacked integrated circuit structure resulting from conventional CMOS processes.

According to these conventional processes, the ferroelectric layer 112 is deposited by sputtering, by chemical vapor deposition, by misted liquid deposition, by spin-on liquid deposition, or by any other suitable means of deposition. Ferroelectric layer 112 is subjected to elevated temperatures for an anneal to optimize the ferroelectric performance in layer 112. These temperatures typically range from 650° C. to 850° C. These temperatures are believed to volatilize bismuth metal and cause defects due to bismuth losses in layered superlattice materials corresponding to ferroelectric layer 112.

It has been discovered through the results of secondary ion mass spectroscopic measurements using cesium as the primary ion that a stoichiometric bismuth deficiency exists in the uppermost portions of conventional layered superlattice materials corresponding to ferroelectric layer 112 of FIG. 3. These experimental results confirm the existence of bismuth volatilization losses. The extent of such losses is a function of the anneal times and temperatures, as well as the deposition method and the presence or absence of other layers, especially top electrode 116, during the anneal. Accordingly, an important function of capping layer 114 is to compensate defects in ferroelectric layers that result from metal volatilization losses. These volatilization losses can include other metals, and do not result from the loss of bismuth alone.

The capping layers 114 and 204 may be produced from sputtered metal that is oxidized in an anneal, the oxidized metal may itself be sputtered, or the layers may be produced from spin-on liquid precursors; such as sol-gels (metal alkoxides), metal carboxylates or metal alkoxycarboxylate solutions. Misted liquid deposition or chemical vapor deposition may also be used.

The non-limiting examples below set forth preferred methods and materials for practicing the invention.

EXAMPLE 1

A substrate was prepared for deposition of ferroelectric layer 112. A conventional silicon wafer was prepared by conventional means to include a thermally grown layer of oxide. Titanium metal was sputtered by conventional DC magnetron means to a thickness of about 20 nm. Platinum metal was sputtered to a thickness of about 180 nm.

A research grade purity solution of metal 2-ethylhexanoates in xylenes was purchased on commercial order from Kojundo Chemical Company of Japan for the deposition of ferroelectric layer 112. The solution contained molar proportions of strontium, bismuth, and tantalum in ratio of 1:2.8:2. Thus, the solution was capable of yielding a layered superlattice material having an empirical formula of $SrBi_{2.8}Ta_2O_{10.2}$ absent bismuth volatilization. This formula contained about 30% more bismuth than was required for the average empirical formula to have a stoichiometry of ferroelectric layer 112 corresponding to Formula (3) above where m=2. Thus, the assumption based upon secondary ion mass spectroscopy data from other samples prepared using the intended anneal conditions for the present substrate was that about 30% of bismuth in the sample would be lost due to volatilization during the anneal. The solution had 0.2 molar concentration of the metals corresponding to the empirical formula. A 3 milliliter aliquot of the solution was mixed with 2 milliliters of n-butyl acetate cosolvent to provide a 0.12M solution with improved substrate wetting capacity.

The substrate was placed in a conventional spin-coater machine. The substrate was spun at 1900 rpm for 30 seconds while 3 ml of solution were applied to the substrate by pipette. This coating activity placed a thin film of precursor liquid on the substrate. The substrate was removed from the spin coating machine and placed on a hot plate in air for 1 minute with the hot plate being maintained at 150° C. for drying of the precursor film by the elimination of solvent. The substrate was next placed on a hot plate at 260° C. for 4 minutes to eliminate additional solvent and organic ligands from the precursor film. The substrate including the dried precursor film was next subjected to rapid thermal processing in air under a conventional halogen lamp RTA device at 725° C. for 30 seconds using a 125° C. per second ramp from room temperature up to 725° C., and a 125° C. ramp back down to room temperature. The steps of precursor deposition through rapid thermal anneal were repeated a second time to build the total thickness of the ferroelectric layer up to about 200 nm.

A research grade purity solution of bismuth 2-ethylhexanoate in xylenes having a 0.4M concentration was purchased on commercial order from Kojundo Chemical Company of Japan. A one ml aliquot of this solution was mixed with 1.6 ml of n-butyl acetate to yield a 0.154M solution. The wafer was placed into a conventional spin-coating machine and spun at 1500 rpm for 30 seconds while the solution was applied by pipette. The substrate was removed from the spin coating machine and placed on a hot plate in air for 1 minute with the hot plate being maintained at 150° C. for drying of the precursor film by the elimination of solvent. The substrate was next placed on a hot plate at 260° C. for 4 minutes to eliminate additional solvent and organic ligands from the precursor film. The steps of precursor deposition through drying were repeated a second time to build the total thickness of the capping layer 114 up to about 10 nm.

A platinum top electrode was sputtered into place using a DC magnetron. The substrate with the top electrode in place was subjected to an 800° C. anneal in a diffusion furnace under positive oxygen flow for 60 minutes, including a five minute ramp up to the maximum temperature, as well as a five minute ramp down. The device was then patterned by a conventional reactive ion etching process including the application of a photo resist followed by ion etching, as will be understood by those skilled in the art. Thus, the substrate provided support for a plurality of square capacitors each having an area of 6940 $\mu m^2$.

Figure 4:
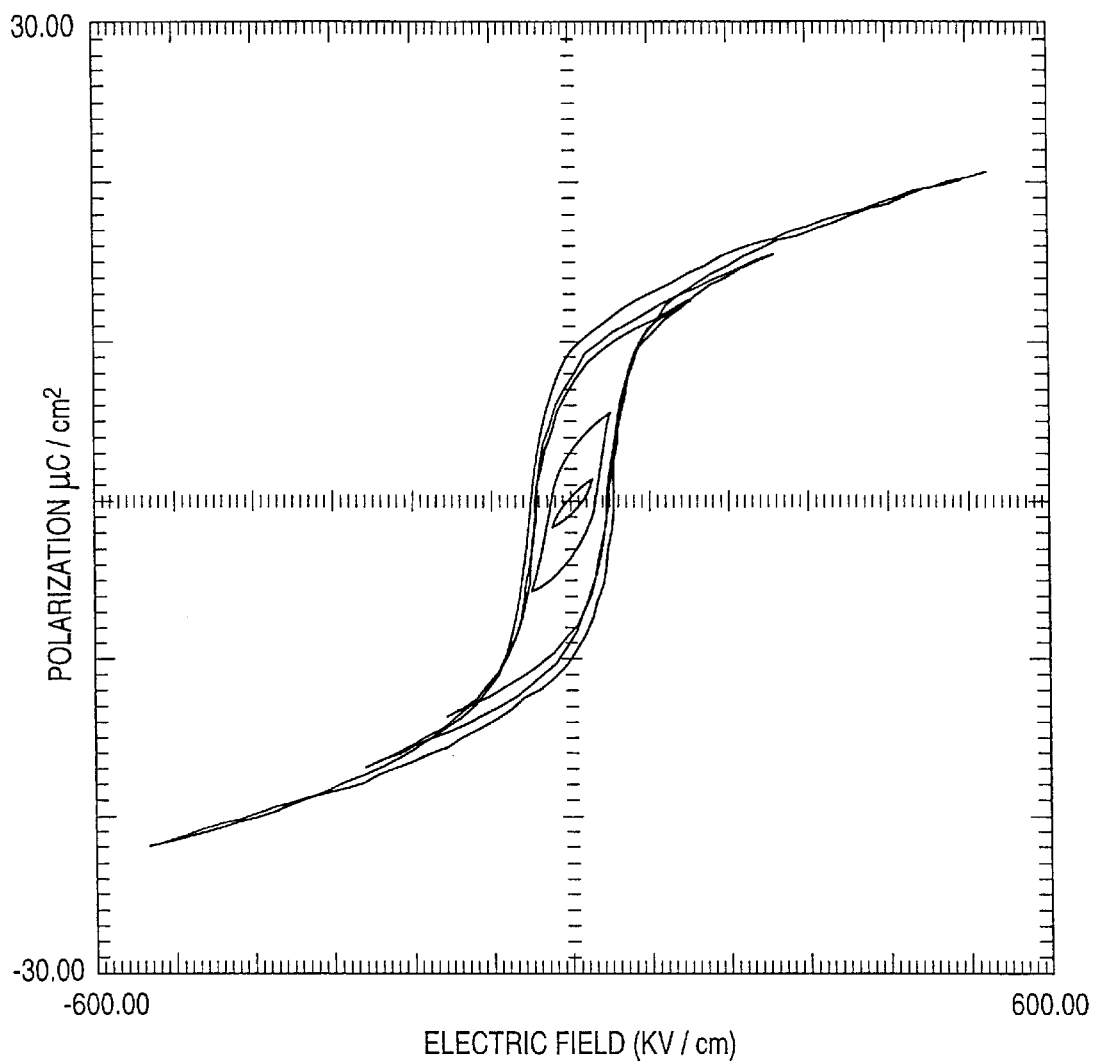
FIG. 4 depicts a polarization hysteresis curve obtained from a sample corresponding to FIG. 1.

A representative capacitor was selected for test measurements. A Hewlett Packard 3314A function generator was connected to a Hewlett Packard 54502A digitizing oscilloscope. Polarization hysteresis measurements were performed using a 10 KHz sine wave at voltage amplitudes of 0.5, 1, 3, 5 and 10 volts. Tests were performed at standard atmospheric pressure in Colorado Springs, Colo. and 20° C. FIG. 4 depicts the hysteresis results.

EXAMPLE 2

Comparative Measurements

Separate wafers were prepared in an identical manner with the process described in Example 1, except there were differences with respect to placement of the bismuth oxide capping layer beneath the top electrode. The substrate from Example 1 is referred to herein as the BiOx/LSM sample for the inclusion of a bismuth oxide layer above the ferroelectric layered superlattice material. This structure corresponds to the ferroelectric device 100 shown in FIG. 1.

An LSM/BiOx sample was prepared corresponding to the ferroelectric device 200 shown in FIG. 2. This device had the bismuth oxide capping layer 204 positioned beneath the ferroelectric layered superlattice material and above the bottom electrode. Accordingly, the process steps of depositing the bismuth oxide precursor and drying were performed immediately after deposition of the bottom electrode, as opposed to immediately after deposition of the ferroelectric layered superlattice material.

An LSM sample was prepared having no capping layer in the ferroelectric capacitor. This device corresponded to ferroelectric device 300 shown in FIG. 3. Accordingly, the steps of depositing the bismuth oxide layer in Example 1 were skipped for the LSM sample.

Figure 5:
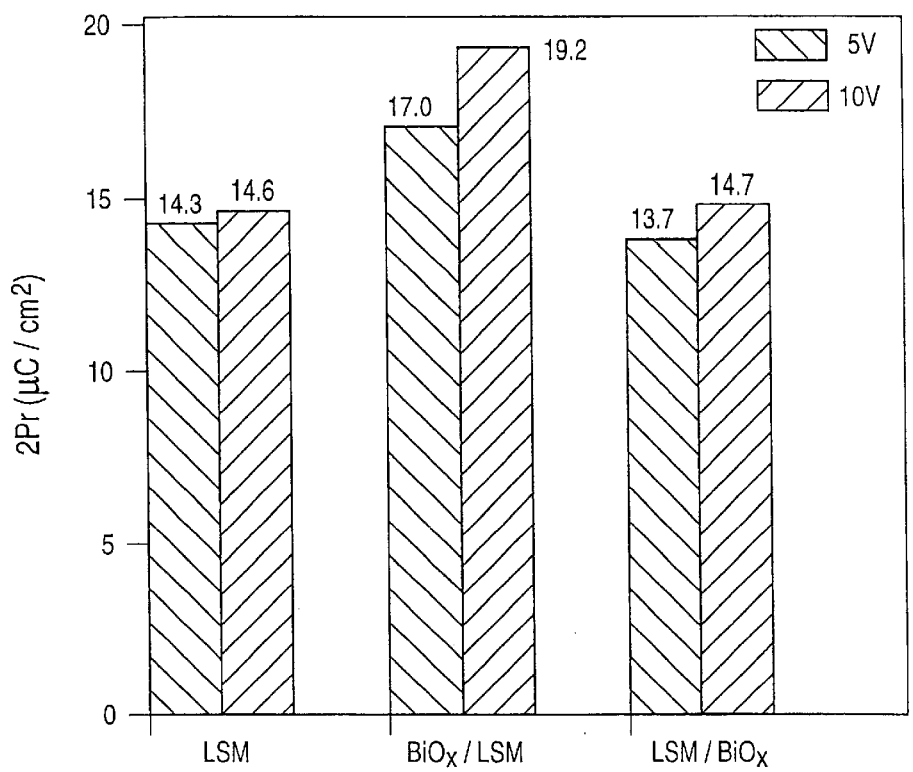
FIG. 5 is a bar graph comparing residual polarization measurements obtained from three respective samples corresponding to FIGS. 1, 2, and 3.

FIG. 5 is a bar graph comparing residual polarization for the respective LSM, BiOx/LSM, and LSM/BiOx samples. The residual polarization values were measured as 2 Pr for 5 and 10 volts taken from hysteresis curves for representative cells on the respective substrates. In comparison to the LSM sample, the BiOx/LSM sample of Example 1 demonstrated a 32% improvement in residual polarization at 10V and a 19% improvement at 5V. The bismuth oxide capping layer was responsible for this improvement. A similar comparison of the LSM sample against the LSM/BiOx sample demonstrated a small improvement in residual polarization at 10V and a 4% decline at 5V.

Figure 6:
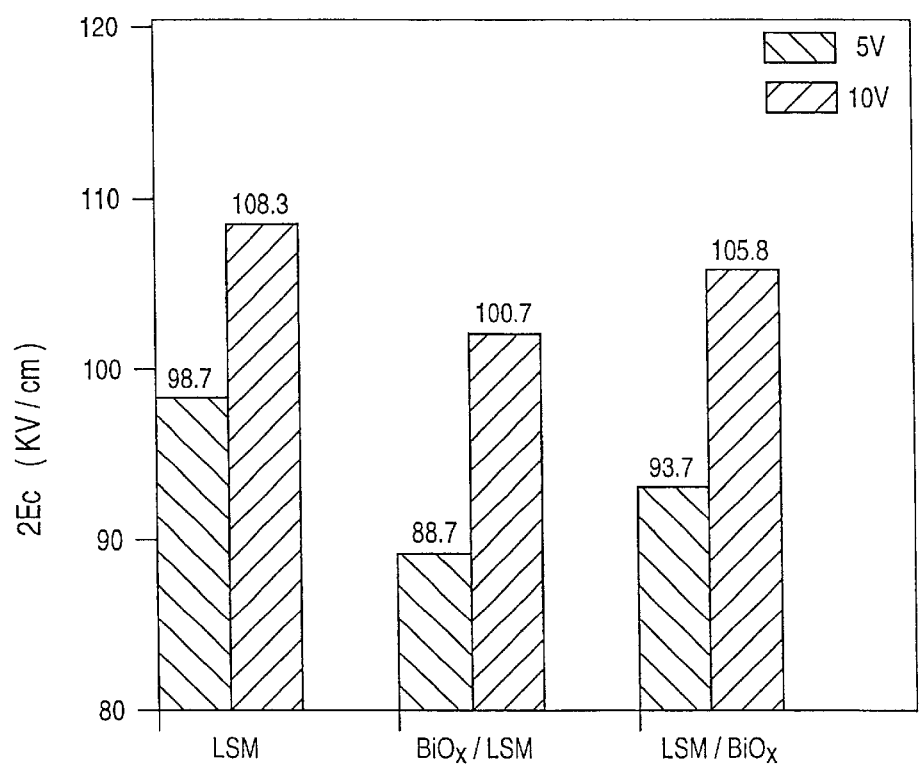
FIG. 6 is a bar graph depicting coercive field measurements obtained from three respective samples corresponding to FIGS. 1, 2, and 3.

FIG. 6 depicts a comparison of the critical switching field determined as 2Ec for each of the samples. The BiOx/LSM sample demonstrated a 7% decline at 10V and a 10% decline at 5V. The LSM/BiOx sample demonstrated smaller declines of 2% at 10V and 5% at 5V. A decline in the 2Ec value is an improvement because a lower voltage is required to switch the polarization state of the ferroelectric material. In integrated circuits, lower voltages are advantageously associated with less heating and less power consumption.

From the above, it is evident that the capacitor with the upper capping layer shows very significant improvement, while the capacitor with the lower capping layer shows a small improvement.

Those skilled in the art will understand that the preferred embodiments described above may be subjected to modifications without departing from the true scope and spirit of the invention. The inventors, accordingly, hereby state their intention to rely upon the Doctrine of Equivalents, in order to protect their full rights in the invention.

What is claimed is:

1. A method of making a ferroelectric device, said method comprising the steps of:
    depositing material for a ferroelectric layer on a substrate, said ferroelectric layer being selected from the group consisting of perovskites and self-ordering layered superlattice materials;

depositing a non-ferroelectric capping layer including a superlattice generator metal adjacent said ferroelectric layer, said capping layer having a thickness in a range of about from 3 nm to 30 nm;

depositing an electrode layer adjacent said capping layer; and annealing one or more of said layers.

2. The method as set forth in claim 1 wherein said step of depositing a ferroelectric layer includes depositing a self-ordering layered superlattice material.

3. The method as set forth in claim 1 wherein said step of depositing a capping layer superlattice generator metal includes depositing an identical superlattice generator metal to a superlattice generator metal in said self ordering layered superlattice material.

4. The method as set forth in claim 1 wherein said step of depositing a superlattice generator metal includes depositing bismuth.

5. The method as set forth in claim 1 wherein said step of depositing materials for a ferroelectric layer includes depositing materials for a layered superlattice material selected from the group consisting of strontium bismuth tantalate, strontium bismuth niobate, and strontium bismuth niobium tantalate.

6. The method as set forth in claim 1 wherein said step of annealing comprises diffusing said capping layer into said ferroelectric layer to form a superlattice generator metal-enriched layered superlattice material.

7. The method as set forth in claim 6 wherein said superlattice generator metal-enriched layered superlattice material is not ferroelectric.

8. The method as set forth in claim 6 wherein said superlattice generator metal-enriched layered superlattice material is ferroelectric.

9. The method as set forth in claim 1 wherein said capping layer is deposited on said ferroelectric layer and said electrode is thereafter deposited on said capping layer.

10. A method of making a ferroelectric device, said method comprising the steps of:

depositing material for a ferroelectric layer on a substrate, said ferroelectric layer being selected for the group consisting of perovskites and self-ordering layered superlattice materials;

depositing a capping layer including a superlattice generator metal adjacent said ferroelectric layer, said capping layer having a thickness in a range of about from 3 nm to 30 nm;

depositing an electrode layer adjacent said capping layer; and annealing one or more of said layers.

11. The method as set forth in claim 10 wherein said step of annealing comprises diffusing said capping layer into said ferroelectric layer to form a superlattice generator metal-enriched layered superlattice material.

12. The method as set forth in claim 11 wherein said superlattice generator metal-enriched layered superlattice material is not ferroelectric.

13. The method as set forth in claim 11 wherein said superlattice generator metal-enriched layered superlattice material is ferroelectric.

14. The method as set forth in claim 10 wherein said capping layer has a thickness ranging from 5 nm to 20 nm.

15. The method as set forth in claim 10 wherein said capping layer is deposited on said ferroelectric layer and said electrode is thereafter deposited on said capping layer.

* * * * *